(12) United States Patent
Backfolk et al.

(10) Patent No.: US 12,286,756 B2
(45) Date of Patent: Apr. 29, 2025

(54) PROCESS FOR PRODUCTION OF NANO-COATED SUBSTRATE

(71) Applicant: Stora Enso OYJ, Helsinki (FI)

(72) Inventors: Kaj Backfolk, Villmanstrand (FI); Isto Heiskanen, Imatra (FI); Jukka Kankkunen, Imatra (FI)

(73) Assignee: Stora Enso OYJ, Helsinki (FI)

( * ) Notice: Subject to any disclaimer, the term of this patent is extended or adjusted under 35 U.S.C. 154(b) by 248 days.

(21) Appl. No.: 17/996,939

(22) PCT Filed: May 6, 2021

(86) PCT No.: PCT/IB2021/053829
§ 371 (c)(1),
(2) Date: Oct. 24, 2022

(87) PCT Pub. No.: WO2021/224838
PCT Pub. Date: Nov. 11, 2021

(65) Prior Publication Data
US 2023/0132010 A1    Apr. 27, 2023

(30) Foreign Application Priority Data
May 7, 2020    (SE) ..................................... 2050523-6

(51) Int. Cl.
| D21H 19/82 | (2006.01) |
| C23C 16/02 | (2006.01) |
| C23C 16/06 | (2006.01) |
| C23C 16/455 | (2006.01) |
| D21F 1/66 | (2006.01) |
| D21H 11/18 | (2006.01) |
| D21H 19/08 | (2006.01) |
| D21H 19/12 | (2006.01) |
| D21H 27/10 | (2006.01) |

(52) U.S. Cl.
CPC ....... D21H 19/828 (2013.01); C23C 16/0272 (2013.01); C23C 16/06 (2013.01); C23C 16/45555 (2013.01); D21F 1/66 (2013.01); D21H 11/18 (2013.01); D21H 19/08 (2013.01); D21H 19/12 (2013.01); D21H 27/10 (2013.01)

(58) Field of Classification Search
CPC ...... D21H 19/828; D21H 11/18; D21H 19/08; D21H 19/12; D21H 27/10; D21H 19/16; D21H 19/82; B32B 15/12; B32B 15/20; B32B 27/10; B32B 29/06; B32B 2255/12; B32B 2255/205; B32B 2307/7244; B32B 2307/7246; C23C 16/0272; C23C 16/06; C23C 16/45555; C23C 14/024; C23C 14/14; B82Y 40/00; B82Y 30/00; C08L 1/04; C08L 1/02; C08J 5/18; B05D 3/00
See application file for complete search history.

(56) References Cited

U.S. PATENT DOCUMENTS

| 5,827,616 A | 10/1998 | Girard et al. | |
| 9,362,231 B2* | 6/2016 | Chiang | B82Y 30/00 |
| 2002/0081393 A1 | 6/2002 | Kjellqvist et al. | |
| 2011/0223401 A1 | 9/2011 | Harlin et al. | |
| 2012/0251818 A1 | 10/2012 | Axrup et al. | |
| 2017/0226625 A1* | 8/2017 | Kawahara | C23C 16/50 |
| 2018/0319143 A1 | 11/2018 | Neagu et al. | |
| 2018/0371696 A1 | 12/2018 | Sunagawa et al. | |
| 2021/0347135 A1* | 11/2021 | van Lengerich | B32B 27/28 |
| 2023/0131438 A1* | 4/2023 | Backfolk | D21H 23/56 |
| | | | 428/220 |
| 2023/0132010 A1* | 4/2023 | Backfolk | D21H 19/828 |
| | | | 162/137 |

FOREIGN PATENT DOCUMENTS

| CN | 102002894 A | | 4/2011 | |
| CN | 108472918 B | * | 2/2021 | B32B 27/12 |
| CN | 118176340 A | * | 6/2024 | B32B 27/10 |
| EP | 0130659 A1 | | 1/1985 | |
| EP | 0819192 A1 | | 1/1998 | |
| EP | 3372400 B1 | * | 8/2024 | B32B 15/08 |
| JP | 2007056084 A | | 3/2007 | |
| JP | 2015093412 A | | 5/2015 | |

(Continued)

OTHER PUBLICATIONS

Extended European Search Report from corresponding European application No. 21800540.3, dated Apr. 15, 2024.

(Continued)

*Primary Examiner* — Jose A Fortuna
(74) *Attorney, Agent, or Firm* — Greer, Burns & Crain, Ltd.

(57) ABSTRACT

The present invention is directed to a process for manufacturing a nano-coated pulp-based substrate comprising the steps of: a) providing a suspension comprising pulp, said pulp having Schopper Riegler value of at least 70°; b) using the suspension of step a) to form a wet web; c) dewatering and/or drying the wet web to form a substrate; d) adding a first layer of an acrylic monomer solution comprising less than 2 wt-% water to the surface of the substrate, followed by radiation curing the first layer; e) optionally adding a second layer comprising an acrylic monomer solution to the surface of the cured first layer and radiation curing the second layer; f) providing a nano-coating on the surface of the cured first or second layer such that a nano-coating having a thickness in the range of from 0.1 nm to 100 nm is provided on the substrate.

9 Claims, No Drawings

(56) References Cited

FOREIGN PATENT DOCUMENTS

| | | | | |
|---|---|---|---|---|
| JP | 2023524280 A | * | 6/2023 | ........... C23C 14/024 |
| KR | 102494816 B1 | * | 2/2023 | ........... A61K 8/0208 |
| SE | 2230230 A1 | * | 2/2024 | ............. B32B 27/10 |
| WO | 9631649 | | 10/1996 | |
| WO | 0077300 A1 | | 12/2000 | |
| WO | 2017046751 A1 | | 3/2017 | |
| WO | WO-2021224838 A1 | * | 11/2021 | ............... B05D 3/00 |
| WO | WO-2021224839 A1 | * | 11/2021 | ........... C09D 101/28 |
| WO | WO-2021224840 A1 | * | 11/2021 | ............... B05D 3/00 |

OTHER PUBLICATIONS

International Search Report from corresponding PCT application No. PCT/IB2021/053829, mailed on Jun. 23, 2021.
Fengel, D., Ultrastructural behaviour of cell wall polysaccharides, TAPPI, 1970, vol. 53, No. 3, pp. 497-503. (Abstract only).
Chinga-Carraso, Gary, Cellulose fibres, nanofibrils and microfibrils: The morphological sequence of MFC components from a plant physiology and fibre technology point of view, Chinga-Carrasco Nanoscale Research Letters, 2011, 6:417.

* cited by examiner

PROCESS FOR PRODUCTION OF NANO-COATED SUBSTRATE

This application is a U.S. National Phase under 35 U.S.C. § 371 of International Application No. PCT/IB2021/053829 filed May 6, 2021, which claims priority under 35 U.S.C. §§ 119 and 365 to Swedish Application No. 2050523-6 filed May 7, 2020.

TECHNICAL FIELD

The present invention is directed to a process for manufacturing a nano-coated pulp-based substrate.

BACKGROUND

Films and barrier papers comprising high amounts of microfibrillated cellulose (MFC) are known in the art. Depending on how they are produced, the films may have particularly advantageous strength and/or barrier properties, whilst being biodegradable and renewable. Films comprising MFC are for example used in the manufacture of packaging materials and may be laminated or otherwise provided on the surface of paper or paperboard materials.

It is known that the barrier properties of MFC films may be negatively influenced by water or moisture. Various chemical and mechanical solutions have been tested such as lamination with thermoplastic polymers.

There is a need for an efficient method for preparing surface treated pulp-based substrates, said surface-treated substrates also providing barrier and strength properties.

Additionally, it would be desirable if such a surface-treated substrate could be compostable and/or easily recyclable and/or repulpable and essentially free from plastic. However, difficulties may arise when providing coatings and surface treatments on cellulose-based substrates. If a dispersion or water based solution is applied onto a thin web or substrate, web breaks or problems with dimensional stability may occur. This is due to water sorption and penetration into the hydrophilic substrate, affecting the hydrogen bonds between the fibrils, fibers, and the additives.

One solution is to increase solids of the applied solutions, although this often leads to higher coat weight and higher viscosity of the solution. High viscosity, on the other hand, generates higher stresses on the substrates and often higher coat weights.

For these reasons, providing sufficient barrier properties is difficult, especially at a low coat weight.

Therefore, aluminum foil or film-forming polymers such as latex or thermoplastic polymers is used for these purposes and generally provides sufficient properties with regard to penetration or diffusion of oil or greases and/or aromas or gas, such as oxygen. The aluminum or film-forming polymers also provide an enhanced water vapor barrier, which is important to barrier and package functionality in high relative humidity conditions or to reduce evaporation of packed liquid products.

However, one issue with the use of aluminum foil is that it poses an environmental challenge, may be a problem in the recycling process and, depending on the amount used, may lead to the packaging material not being compostable. It is therefore desirable to use as small amount of aluminum as possible. However, at the same time it is essential to maintain the barrier properties of the packaging material.

It is known in the art to provide nano-coatings that can be organic or inorganic, such as ceramic or metal nano-coatings. The nano-coatings are very thin, such as from about 0.1 nm to about 100 nm in thickness. For example, metallized surfaces using a very small amount of metal or metal oxides, such as aluminum or $TiO_2$, $Al_2O_3$, MgO or ZnO. For example, atomic layer deposition (ALD), dynamic compound deposition (DCD), chemical vapor deposition (CVD), such as plasma CVD, physical vapor deposition (PVD) and metal plasma-deposition are techniques suitable to provide a small amount of metal on a surface. However, it remains essential that the packaging material, when provided with a nano-coating such as being metallized, can maintain barrier properties and is sufficiently crack-resistant.

One issue with film-forming polymers such as latex and thermoplastic fossil-based polymers is that the packaging material obtained is typically not considered as a monomaterial and issues may arise with recycling. A further problem with many film-forming polymers is that the film-forming polymers are usually provided in the form of aqueous solutions or dispersions. The water content of the solutions or dispersions may disrupt the paper substrate. Hydrophilic cellulose materials typically provide barrier properties to oxygen, but are sensitive to water and water vapour.

Therefore, a substrate adapted such that a very small amount of nano-coating can be applied without deteriorating barrier properties is needed.

SUMMARY

It has surprisingly been found that some or all of the aforementioned problems can be solved by providing an improved method of manufacturing a nano-coated substrate, having water vapor barrier properties.

It has surprisingly been found that by using a process wherein a suspension comprising pulp is provided, said pulp having Schopper Riegler value of at least 70°, using the suspension to form a wet web, followed by dewatering and/or drying, followed by adding a first layer of an acrylic monomer solution comprising less than 2 wt-% water, followed by radiation curing the first layer, optionally followed by adding a second layer comprising acrylic monomer and radiation curing the second layer, followed by providing a nano-coating such that a nano-coating layer having a thickness in the range of from 0.1 nm to 100 nm is provided on the substrate, advantageous barrier properties, particularly water vapor barrier properties, can be achieved.

Thus, the present invention is directed to a process for the production of a nano-coated substrate comprising the steps of:
  a) providing a suspension comprising pulp, said pulp having Schopper Riegler value of at least 70°;
  b) using the suspension of step a) to form a wet web;
  c) dewatering and/or drying the wet web to form a substrate;
  d) adding a first layer of an acrylic monomer solution comprising less than 2 wt-% water to the surface of the substrate, followed by radiation curing the first layer;
  e) optionally adding a second layer comprising an acrylic monomer solution to the surface of the cured first layer and radiation curing the second layer;
  f) providing a nano-coating on the surface of the cured first or second layer such that a nano-coating having a thickness in the range of from 0.1 nm to 100 nm is provided on the substrate.

Thus, one aspect of the present invention is a nano-coated pulp-based substrate coated with a first layer of an acrylic monomer solution which has been cured and optionally a second layer of an acrylic monomer solution which has been cured on the surface of the first cured layer and having a nano-coating on the surface of the cured first or second layer such that the nano-coating has a thickness in the range of from 0.1 nm to 100 nm.

DETAILED DESCRIPTION

The suspension used in step a) comprises pulp, said pulp having a Schopper Riegler value (SR°) of more than 70 SR°, such as from 70 to 95 SR° or from 75 to 85 SR°. The Schopper-Riegler value can be determined through the standard method defined in EN ISO 5267-1.

The pulp in the suspension can be produced using methods known in the art and may for example be kraft pulp, which has been refined to achieve the desired Schopper Riegler value. The pulp may also comprise microfibrillated cellulose (MFC). The pulp may be a mix of essentially unrefined pulp, mixed with highly refined pulp and/or MFC. The suspension may, in addition to the pulp, comprise additives typically used in papermaking.

The suspension in step a) may comprise a mixture of different types of fibers, such as microfibrillated cellulose, and an amount of other types of fiber, such as kraft fibers, fines, reinforcement fibers, synthetic fibers, dissolving pulp, TMP or CTMP, PGW, recycled fibers/pulp etc.

The suspension in step a) may also comprise other process or functional additives, such as fillers, pigments, wet strength chemicals, retention chemicals, cross-linkers, softeners or plasticizers, adhesion primers, wetting agents, biocides, optical dyes, colorants, fluorescent whitening agents, de-foaming chemicals, hydrophobizing chemicals such as AKD, ASA, waxes, resins etc.

The wet web may be formed for example by wet laid or cast forming methods. For wet laid formation, the process may be carried out in a paper making machine such as a fourdrinier or other forming types such as Twin-former or hybrid former. The web can be single or multilayer web or singly or multiply web, made with one or several headboxes.

The microfibrillated cellulose preferably has a Schopper Riegler value (SR°) of more than 70 SR°, or more than 75 SR°, or more than 80 SR°. The microfibrillated cellulose has a surface area of at least 30 $m^2/g$ or more preferably more than 60 $m^2/g$ or most pref. >90 $m^2/g$ when determined according to nitrogen adsorption (BET) method for a solvent exchanged and freeze dried sample.

The microfibrillated cellulose content of the suspension may be in the range of from 15 to 99.9 weight-% based on the weight of solids of the suspension. In one embodiment, the microfibrillated cellulose content of the suspension may be in the range of 30 to 90 weight-%, in the range of 35 to 80 weight-% or in the range of from 40 to 60 weight-%.

The wet web can be prepared for example by wet laid and cast forming methods. In the wet laid method, the suspension is prepared and provided to a porous wire. The dewatering occurs through the wire fabric and optionally also in a subsequent press section. The drying is usually done using convection (cylinder, metal belt) or irradiation drying (IR) or hot air. A typical wet laid is for example the fourdrinier former used in papermaking. In the cast forming method the wet web is formed for example on a polymer or metal belt and the subsequent initial dewatering is predominantly carried out in one direction, such as via evaporation using various known techniques.

The dewatering and/or drying of the web is carried out such that the moisture content at the end of the dewatering and/or drying is preferably less than 50 wt-%, more preferably less than 20 wt-%, most preferably less than 10 wt-%, even more preferably less than 5 wt-%.

The basis weight of the substrate obtained in step c), before being provided with the nano-coating, is preferably less than 100 $g/m^2$, more preferably less than 70 $g/m^2$ and most preferably less than 35 $g/m^2$. The basis weight of the obtained substrate is, before being provided with the nano-coating, preferably at least 10 $g/m^2$.

Preferably, the substrate is free from fluorochemicals.

The substrate obtained in step c) may optionally be surface treated by for example calendering prior to step d). Step d) may be carried out in a machine and/or location different from that of step c).

The substrate obtained in step c), i.e. prior to adding the first layer of a monomeric solution to the surface of the substrate, preferably has barrier properties such that the Gurley Hill porosity value of the substrate is higher than 4000 s/100 ml, preferably higher than 6000 s/100 ml and most preferably higher than 10000 s/100 ml. The Gurley Hill value can be determined using methods known in the art (ISO 5636-5).

The substrate obtained in step c) typically comprises more than 5 pinholes/$m^2$, such as more than 8 pinholes/$m^2$ or more than 10 pinholes/$m^2$, as measured according to standard EN13676:2001.

Step d) of the process according to the present invention involves adding a first layer of an acrylic monomer solution to the surface of the substrate, followed by radiation curing the first layer. The monomer is preferably an organic acrylic monomer. Example of suitable monomers are multi-functional acrylic monomers including isobornyl acrylate (IBOA), tripropylene glycol diacrylate (TPGDA), trimethylol propane triacrylate (TMPTA), di-penta-erythritol hexaacrlate (DPHA), tri-functional aliphatic urethan acrylate and phenyl ethyl acrylate. Typically, the solution does not contain any solvent. If a solvent is used, the solvent is preferably non-aqueous. Preferably, the acrylic monomer solution is applied with flexogravure, inkjet, screen rotogravure or reverse rotogravure or offset printing methods or variations or modification thereof. The acrylic monomer solution may also be applied by curtain coating, foam coating, spray coating, blade coating or e.g. by printing. Printing can also be carried out in an offline coating station. The acrylic monomer solution may also be applied by spraying (such as the monomer solution in atomized form) or in the form of gas or vapor. Flash evaporation may take place, in addition to the radiation curing. The acrylic monomer solution may also comprise other monomers and/or acrylic oligomers. The amount of acrylic monomer in the solution is preferably at least 30 wt % (based on total solid content).

The solution used in step d) may also comprise up to 20 wt % (based on total solid content) inorganic pigment or filler, such as nanoclay or silane or silicate precursors. The solution used in step d), may also comprise up to 20 wt-% (based on total solid content), such as 5-20 wt-% microfibrillated cellulose and/or nanocrystalline cellulose.

The thickness of the first layer, after curing, is preferably 0.2-20 μm, most preferably 0.5-10 μm. The first layer may cover the entire substrate or part of the substrate. For example, the first layer may provided in the form of dots, covering for example in the range of from 10 to 90% of the surface of the substrate, such as from 30 to 70% of the surface of the substrate.

The radiation curing in step d) is carried out using methods known in the art, such as UV curing or electron beam curing. When UV curing is used, the acrylic monomer solution also comprises a photoinitiator such as benzophenone or dimethyl-N-amino ethyl methacrylate. Typically, the radiation curing reduces the number of viable microorganisms on the surface by a factor of at least 100, preferably by a factor of at least 1000, more preferably by a factor of at least 10000.

Step d) may be carried out on one or both sides of the substrate.

The basis weight of the substrate, after being provided with the nano-coating, is preferably less than 100 g/m$^2$, more preferably less than 70 g/m$^2$ and most preferably less than 35 g/m$^2$. The basis weight of the obtained substrate is, after being provided with the nano-coating, preferably at least 10 g/m$^2$.

The coated substrate obtained in step d) preferably comprises less than 5 pinholes/m$^2$, preferably less than 3 pinholes/m$^2$, and more preferably less than 2 pinholes/m$^2$, as measured according to standard EN13676:2001. The KIT value is preferably at least 10, more preferably at least 11, most preferably 12. The KIT value can be determined using methods known in the art such as the TAPPI UM 557 method.

Step e) of the process according to the present invention involves adding a second layer of an acrylic monomer solution to the cured first layer obtained in step d), followed by radiation curing the second layer. The monomer is preferably an organic acrylic monomer as exemplified above for step d). Typically, the solution does not contain any solvent. If a solvent is used, the solvent is preferably non-aqueous.

The thickness of the second layer is preferably 0.2-20 μm, most preferably 0.5-10 μm.

The radiation curing in step e) is carried out using the same methods as for step d).

If necessary, steps d) and/or e) may be repeated before step f).

Steps d) and e) of the process according to the present invention have the effect of reducing the surface roughness of the substrate and prepares the substrate for the subsequent nano-coating step, thereby enabling the application and use of the very thin nano-coating. More specifically, steps d) and e) have the effect of reducing the nano-scale surface roughness of the substrate.

Nanoscale roughness of a substrate can be determined using methods known in the art. For example, the roughness can be determined by atomic force microscopy or by use of scanning electron microscopy.

The nanoscale surface roughness of the substrate according to the present invention is low, i.e. the surface is very smooth on a nanoscale. Roughness is often described as closely spaced irregularities. Nanoscale roughness can be measured by atomic force microscopy. For example, an area of the substrate obtained in step d) (i.e. before any nano-coating has been applied), preferably an area of between 5 μm×5 μm and 100 μm×100 μm, can be can observed using atomic force microscopy. The surface structure, i.e. peaks and valleys can be determined and the root-mean-square (RMS) roughness or peak-to-valley height parameters can be calculated, quantifying the nanoscale surface roughness (Peltonen J. et al. Langmuir, 2004, 20, 9428-9431). For the substrates obtained in step e) according to the present invention, the RMS determined accordingly is generally below 100 nm, preferably below 80 nm.

The nano-coating is very thin, from 0.1 nm to about 100 nm in thickness. The nano-coating can be organic or inorganic, such as ceramic or metal nano-coatings. For example, metallized surfaces using a very small amount of metal or metal oxides, such as aluminum or $TiO_2$, $Al_2O_3$, MgO or ZnO. In one embodiment, the nano-coating comprises aluminum.

The step of providing the nanocoating (step f) of the process) can be carried using for example atomic layer deposition (ALD), dynamic compound deposition (DCD), chemical vapor deposition (CVD), such as plasma CVD, physical vapor deposition (PVD) and metal plasma-deposition. The nano-coating is preferably carried out by atomic layer deposition (ALD). The nano-coating can be an in-line process, i.e. carried out in the same equipment and/or in the same location as steps a) to e). Alternatively, the nano-coating can be carried out separately, i.e. in a separate equipment and/or in another location than steps a) to e). The nano-coating can be carried out on one or both sides of the substrate.

After providing the nano-coating, a protective coating in the form of a binder, varnish or tie layer may optionally be applied on the nano-coating. Examples of binders include microfibrillated cellulose, SB latex, SA latex, PVAc latex, starch, carboxymethylcellulose, polyvinyl alcohol etc. The amount of binder used in a protective coating is typically 1-40 g/m$^2$, preferably 1-20 g/m$^2$ or 1-10 g/m$^2$. Such a protective coating may be provided using methods known in the art. For example, the protective coating can be applied in one or two layers with e.g. contact or non-contact deposition techniques. Said protective coating can further provide for example heat sealability, liquid and/or grease resistance, printing surface and rub resistance.

According to a further embodiment of the present invention, there is provided a laminate comprising the nano-coated substrate prepared according to the present invention. Such a laminate may comprise a thermoplastic polymer (fossil based or made from renewable resources) layer, such as any one of a polyethylene, polyvinyl alcohol, EVOH, starch (including modified starches), cellulose derivative (Methyl cellulose, hydroxypropyl cellulose etc), hemicellulose, protein, styrene/butadiene, styrene/acrylate, acryl/vinylacetate, polypropylene, a polyethylene terephthalate, polyethylene furanoate, PVDC, PCL, PHB, and polylactic acid. The thermoplastic polymer layer can be provided e.g. by extrusion coating, film coating or dispersion coating. This laminate structure may provide for even more superior barrier properties and may be biodegradable and/or compostable and/or repulpable. In one embodiment, the nano-coated substrate according to the present invention can be present between two coating layers, such as between two layers of polyethylene, with or without a tie layer. According to one embodiment of the present invention, the polyethylene may be any one of a high density polyethylene and a low density polyethylene or mixtures or modifications thereof that could readily be selected by a skilled person. According to further embodiment there is provided the nano-coated substrate or the laminate according to the present invention, wherein said nano-coated substrate or said laminate is applied to the surface of any one of a paper product and a board. The nano-coated substrate or laminate can also be part of a flexible packaging material, such as a free standing pouch or bag. The nano-coated substrate or laminate can be incorporated into any type of package, such as a box, bag, a wrapping film, cup, container, tray, bottle etc.

One embodiment of the present invention is a nano-coated substrate produced according to the process of the present invention.

The OTR (oxygen transmission rate) value (measured at standard conditions) of the nano-coated substrate is preferably <5 cc/(m$^2$*day) measured at 50% RH, 23° C., preferably <3, more preferably <2 and most preferably <1 at a grammage of 10-50 g/m$^2$.

The water vapor transmission rate (WVTR) of the nano-coated substrate, determined according to the standard ISO 15106-2/ASTM F1249 at 50% relative humidity and 23° C., is less than 5 g/m$^2$/day, more preferably less than 3 g/m$^2$/day.

The thickness of the nano-coated substrate can be selected dependent on the required properties. The thickness may for example be 10-100 μm, such as 20-50 or 30-40 μm, having a grammage of for example 10-100 g/m$^2$, such as 20-30 g/m$^2$. The nano-coated substrate typically has very good barrier properties (e.g. to gas, fat or grease, aroma, light etc).

A further embodiment of the present invention is a product comprising the nano-coated substrate produced according to the process of the present invention. Typically, the nano-coated substrate according to the present invention is re-pulpable.

One embodiment of the present invention is a flexible package comprising a nano-coated substrate produced according to the process of the present invention. A further embodiment of the invention is a rigid package comprising a nano-coated substrate according to the present invention.

Microfibrillated cellulose (MFC) shall in the context of the patent application mean a nano scale cellulose particle fiber or fibril with at least one dimension less than 100 nm. MFC comprises partly or totally fibrillated cellulose or lignocellulose fibers. The liberated fibrils have a diameter less than 100 nm, whereas the actual fibril diameter or particle size distribution and/or aspect ratio (length/width) depends on the source and the manufacturing methods.

The smallest fibril is called elementary fibril and has a diameter of approximately 2-4 nm (see e.g. Chinga-Carrasco. G., *Cellulose fibres, nanofibrils and microfibrils: The morphological sequence of MFC components from a plant physiology and fibre technology point of view, Nanoscale research letters* 2011, 6:417), while it is common that the aggregated form of the elementary fibrils, also defined as microfibril (Fengel, D., *Ultrastructural behavior of cell wall polysaccharides, Tappi J.*, March 1970, Vol 53, No. 3.), is the main product that is obtained when making MFC e.g. by using an extended refining process or pressure-drop disintegration process. Depending on the source and the manufacturing process, the length of the fibrils can vary from around 1 to more than 10 micrometers. A coarse MFC grade might contain a substantial fraction of fibrillated fibers, i.e. protruding fibrils from the tracheid (cellulose fiber), and with a certain amount of fibrils liberated from the tracheid (cellulose fiber).

There are different acronyms for MFC such as cellulose microfibrils, fibrillated cellulose, nanofibrillated cellulose, fibril aggregates, nanoscale cellulose fibrils, cellulose nanofibers, cellulose nanofibrils, cellulose microfibers, cellulose fibrils, microfibrillar cellulose, microfibril aggregates and cellulose microfibril aggregates. MFC can also be characterized by various physical or physical-chemical properties such as large surface area or its ability to form a gel-like material at low solids (1-5 wt %) when dispersed in water. The cellulose fiber is preferably fibrillated to such an extent that the microfibrillated cellulose has a surface area of at least 30 m$^2$/g or more preferably more than 60 m$^2$/g or most pref. >90 m$^2$/g when determined according to nitrogen adsorption (BET) method for a solvent exchanged and freeze dried sample.

Various methods exist to make MFC, such as single or multiple pass refining, pre-hydrolysis followed by refining or high shear disintegration or liberation of fibrils. One or several pre-treatment step is usually required in order to make MFC manufacturing both energy efficient and sustainable. The cellulose fibers of the pulp to be supplied may thus be pre-treated enzymatically or chemically, for example to reduce the quantity of hemicellulose or lignin. The cellulose fibers may be chemically modified before fibrillation, wherein the cellulose molecules contain functional groups other (or more) than found in the original cellulose. Such groups include, among others, carboxymethyl (CM), aldehyde and/or carboxyl groups (cellulose obtained by N-oxyl mediated oxydation, for example "TEMPO"), or quaternary ammonium (cationic cellulose). After being modified or oxidized in one of the above-described methods, it is easier to disintegrate the fibers into MFC or nanofibrillar size fibrils.

The nanofibrillar cellulose may contain some hemicelluloses; the amount is dependent on the plant source. Mechanical disintegration of the pre-treated fibers, e.g. hydrolysed, pre-swelled, or oxidized cellulose raw material is carried out with suitable equipment such as a refiner, grinder, homogenizer, colloider, friction grinder, ultrasound sonicator, fluidizer such as microfluidizer, macrofluidizer or fluidizer-type homogenizer. Depending on the MFC manufacturing method, the product might also contain fines, or nanocrystalline cellulose or e.g. other chemicals present in wood fibers or in papermaking process. The product might also contain various amounts of micron size fiber particles that have not been efficiently fibrillated.

MFC is produced from wood cellulose fibers, both from hardwood or softwood fibers. It can also be made from microbial sources, agricultural fibers such as wheat straw pulp, bamboo, bagasse, or other non-wood fiber sources. It is preferably made from pulp including pulp from virgin fiber, e.g. mechanical, chemical and/or thermomechanical pulps. It can also be made from broke or recycled paper.

EXAMPLES

Comparative Example 1 (Uncoated Thin Substrate)

The substrate was a 32 g/m$^2$ substrate prepared from a fiber-MFC furnish having SR value of about 90°.

The Gurley-Hill value for the substrate was about 35000 s/100 ml.

The substrate had no gas or water vapor barrier properties. OTR and WVTR were not measurable.

Example 1

A lab desktop study was made using an IGT device for applying acrylate based UV varnish onto a substrate as above which was slightly more porous (Gurley Hill ca 10000 s/100 ml). The anilox volume was 16 ml/m$^2$.

(Printing/coating conditions: Anilox 150N, printing 150N, speed 0.3 m/s and one printing level). No shrinkage or runnability problems were seen.

The WVTR determined for the sample was 84 g/m$^2$/day at 23 C/50% RH.

Example 2

The base from comparative example 1 was used in a printing machine (flexography). The Anilox cell volume was 15 ml/m$^2$ and speed was 15 m/min.

The applied varnish was an acrylate based UV varnish. The printing plate was designed to give full coverage on the substrate. It was assumed that ca 30-40% of the Anilox cell volume was transferred to the substrate.

5 UV lamps were used for curing. The obtained WVTR was 94 g/m²/day (Measured from the varnish side), while OTR was 1275 cc/m²/day.

Example 3

Similar as example 2 but both sides were printed with the settings described above. The obtained WVTR was 65 g/m²/day, whereas the OTR was 2.8 cc/m²/day.

These results thus confirms that a thin web containing a high amount of MFC (which is usually very water sensitive) can be coated with a water-less coating without runnability problems.

This means also that the surface is closed and will be very smooth and suitable for nano-coating, which will provide high barrier performance (OTR<5 and WVTR<5). It is also expected that this structure can be printed on one side or two side before nano-coating. It is also evident that these samples have good grease resistance.

Example 4

A 32 g/m² base web comprising high amount of MFC (as above) having slightly higher Gurley Hill value (35000 s/100 ml) was UV printed on both sides. The obtained KIT value was 12 and OTR<6 and WVTR was 67 g/m²/day.

In view of the above detailed description of the present invention, other modifications and variations will become apparent to those skilled in the art. However, it should be apparent that such other modifications and variations may be effected without departing from the spirit and scope of the invention.

The invention claimed is:

1. A process for the production of a nano-coated substrate comprising the steps of:
    a) providing a suspension comprising pulp, said pulp having Schopper Riegler value of at least 70°;
    b) using the suspension of step a) to form a wet web;
    c) dewatering, or drying, or dewatering and drying the wet web to form a substrate which is surface treated before step d);
    d) adding a first layer of an acrylic monomer solution comprising less than 2 wt-% water to a surface of the substrate, followed by radiation curing the first layer;
    e) adding a second layer comprising an acrylic monomer solution a surface of the first layer that has been cured, followed by radiation curing the second layer, and,
    f) providing a nano-coating on a surface of a cured second layer such that a nano-coating having a thickness in a range of from 0.1 nm to 100 nm is provided on the substrate.

2. The process according to claim 1, wherein the monomer used in step d) is an organic acrylic monomer.

3. The process according to claim 1, wherein the Gurley Hill porosity value of the substrate obtained in step c) is higher than 4000 s/100 ml.

4. The process according to claim 1, wherein the suspension in step a) comprises microfibrillated cellulose.

5. The process according to claim 4, wherein a content of microfibrillated cellulose of the suspension in step a) is at least 60 weight-% based on a weight of solids of the suspension.

6. The process according to claim 1, wherein radiation curing in step d) comprises electron beam curing.

7. The process according to claim 1, wherein the nano-coating applied in step e) comprises aluminum.

8. The process according to claim 1, wherein step e) is carried out by atomic layer deposition.

9. The process of claim 1, wherein the nano-coating comprises a metal.

* * * * *